United States Patent [19]

Greenwood

[11] Patent Number: 4,545,682

[45] Date of Patent: Oct. 8, 1985

[54] OPTICAL GYROSCOPE

[75] Inventor: Ivan Greenwood, Stamford, Conn.

[73] Assignee: The Singer Company, Little Falls, N.J.

[21] Appl. No.: 522,012

[22] Filed: Aug. 11, 1983

[51] Int. Cl.[4] .............................................. G01C 9/64
[52] U.S. Cl. .................................................. 356/350
[58] Field of Search ........................... 356/350; 372/94

[56] References Cited

U.S. PATENT DOCUMENTS 4,299,490  11/1981  Cahill et al. ......................... 356/350
4,372,685  2/1983  Ulrich ................................. 356/350

OTHER PUBLICATIONS

Davis et al., "Techniques for Shot Noise Limited Inertial Rotation Measurement Using a Multiturn Fiber Sagnac Interferometer", SPIE, 1978, pp. 131-136.

Primary Examiner—Vincent P. McGraw
Assistant Examiner—S. A. Turner
Attorney, Agent, or Firm—Thomas W. Kennedy

[57] ABSTRACT

A light source signal is amplitude modulated by a phase modulated sinusoid and passes through two directional couplers so that two beams are formed. The beams are transmitted to the ends of an optic-fiber coil for propagation therethrough in opposite circular directions. An optical phase modulator is present at one end of the coil so that a phase modulation of fixed frequency and amplitude is introduced to a first beam as it enters the coil and to the counterpropagating beam as it leaves the coil. The counterpropagating beams produce a signal at a photodetector which is a function of rotation rate. An electronic control unit is connected to the photodetector to generate a digital signal output as a frequency which is a measure of rotation rate. A feedback loop is completed by connecting a signal, produced by the control unit, to the amplitude modulated light source for nulling the phase shift due to rotation rate.

10 Claims, 4 Drawing Figures

OPTICAL GYROSCOPE

FIELD OF THE INVENTION

The present invention relates to interferometer gyroscopes and more particularly to a fiber-optic laser gyroscope.

BRIEF DESCRIPTION OF THE PRIOR ART

In recent years a number of designs have been proposed for fiber-optic laser gyroscopes using the phenomena long recognized in the Sagnac interferometer, as discussed in the publication by Culshaw and Giles, "Fibre Optic Gyroscopes," *J. Phys. E. Sci. Instrum.*, Vol. 16, 1983, pages 5–15. The basic concept is that light travelling in clockwise and counterclockwise directions through a fiber-optic coil emerges with a slight time and hence optical phase difference between the two paths when the coil is rotating about its axis.

More recent developments in this are are typified in U.S. Pat. No. 4,273,444 to Pool et al and U.S. Pat. No. 4,299,490 to Cahill et al. In the type of phase nulling optical gyroscopes (gyros) disclosed in these patents, there is included a source of light and first and second means for modulating respectively a fixed frequency onto a first portion of a light source emission and for modulating a variable frequency onto a second portion of the light source emission. A light path is provided which has an axis of sensitivity the rotation about which is desired to be measured. The light path is disposed in a manner whereby the modulated first component traverses the light path in one direction and the second modulated component traverses the light path in the opposite direction. The first and second modulating means are each operative upon a respective one of the first and second light portions before it has traversed the light path and a respective other of the light portions after it has traversed the light path to affect both in the same manner. Means are provided for producing a signal representing the phase difference between the first and second modulated portions introduced by the rotation of the light path about the axis of sensitivity as the first and second portions traverse the light path. Means are also provided for integrating the phase difference representing signal. The integrating means is operative to change the variable frequency to produce a null phase difference representing signal. Thus, the difference between the fixed and variable frequencies represents the rate of rotation of the fiber coil about its axis of sensitivity.

Although a precise fiber-optic laser gyro is possible utilizing the teachings of the mentioned prior art, costly frequency shifters are required to achieve the mentioned change in variable frequency to produce a null phase difference. As discussed in the Pool patent, it is customary for two acoustooptical devices to be used. Such devices are difficult to fabricate and expensive. They require relatively large amounts of power and are known to have problems with stray acoustic power. They are generally not considered a proper production solution. Electro-optical frequency shifters have been recognized as more desirable and they have been conceived in the form of optical single sideband modulators. However, the present state of the art has not produced a satisfactory modulator of this type.

BRIEF DESCRIPTION OF THE PRESENT INVENTION

The present invention is a departure from the approach taken by the prior art. Instead of utilizing the frequency shifting components as described, the present invention includes means for driving a laser light source in a closed loop to achieve desired phase nulling. It is the essence of the present invention that two frequencies differing by $\Delta\omega$ both propagate in clockwise and counterclockwise directions around a fiber coil, rather than one frequency in each direction, as is done in the prior art. By appropriate phase modulations, each frequency and direction becomes "labeled" so that one desired combination can be extracted and all other terms rejected. This conceptual complexity leads to apparatus simplicity. The approach of the present invention permits the use of low cost, reliable and stable components which consume relatively little energy. This results in a gyroscope of substantially lower cost than those of the prior art. These advantages are gained while preserving high accuracy.

The above-mentioned objects and advantages of the present invention will be more clearly understood when considered in conjunction with the accompanying drawings, in which:

DETAILED DESCRIPTION OF THE INVENTION

Figure 1:
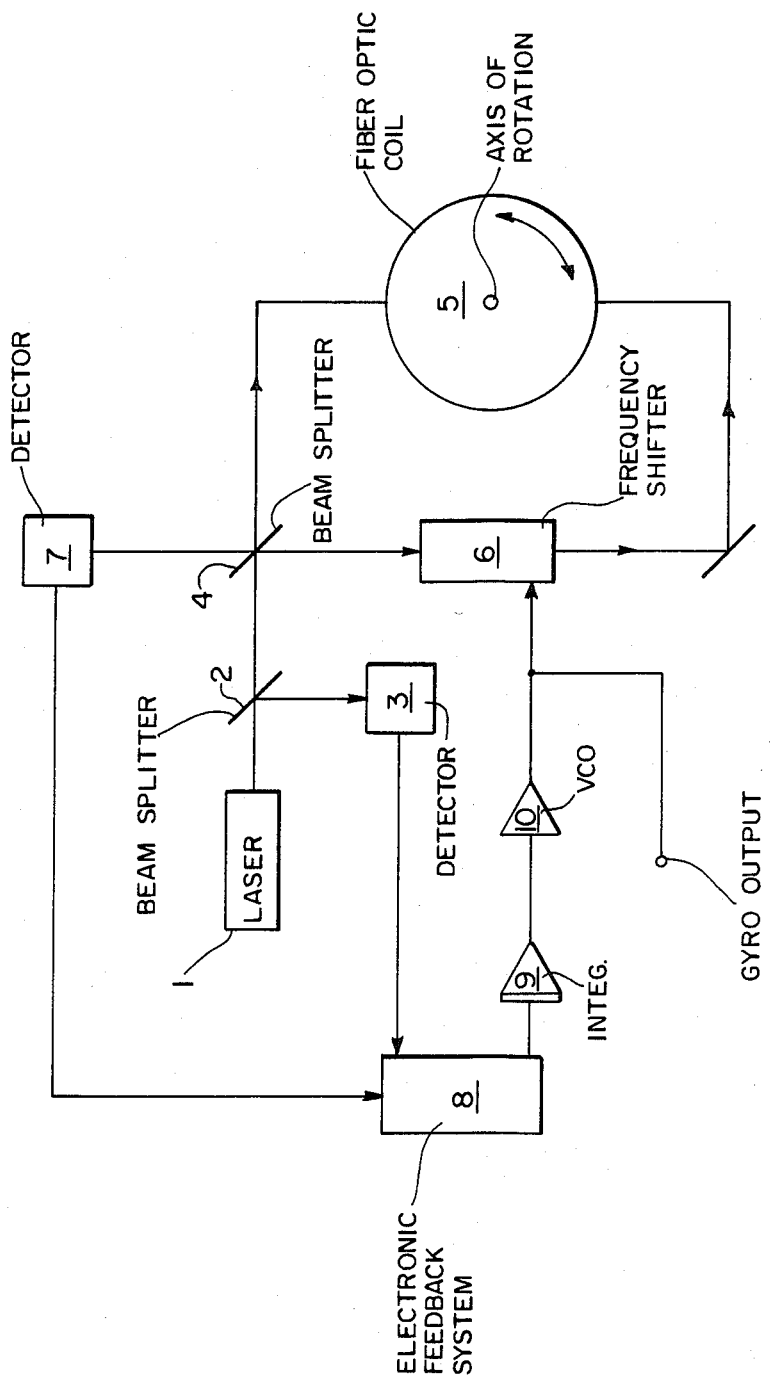
FIG. 1 is a block diagram of a prior art optical gyroscope.

Preceding a specific description of the present invention, it is instructive to review the phase nulling fiber-optics laser gyro disclosed in the previously mentioned U.S. Pat. No. 4,299,490 to Cahill et al. As shown in FIG. 1, light from a single-frequency laser (1) passes through a beam splitter (2). One beam reflects onto a detector (3) that monitors extraneous laser-amplitude fluctuations and provides a correction to a gain-control amplifier for signal-level normalization in the electronic-feedback system (8). The second beam is intercepted by the beam splitter (4) and directed into each end of a fiber coil, generating two counterpropagating beams. When the coil rotates about its axis of symmetry, the relative pathlengths of the two beams will be changed. On clockwise (cw) rotation of the coil, the pathlength of the cw beam will be lengthened while the path of the counterclockwise (ccw) beam will be shortened. Consequently, the two beams exhibit a nonreciprocal phase shift that is due to rotation. Before entering the fiber coil (5), the ccw beam passes through a frequency shifter (6), while conversely the cw beam enters the fiber coil and then passes through the frequency shifter. Thus, the two beams are of equal frequency when mixed at the detector (7), although they are of different frequencies while counterpropagating through the fiber coil. The action of the frequency shifter is twofold: (A) by changing the frequency of one counterpropagating beam relative to the other in the fiber coil, it generates a nonreciprocal phase shift, which can be used to null the nonreciprocal phase shift due to rotation, and (B) it provides the means to produce an oscillatory relative phase shift (phase dither) between the counterpropagating beams for implementing an ac phase-sensitive detection method. On a change of rotation rate, a signal is detected that is the first harmonic of the phase dither with an amplitude proportional to the change of rotation rate. This signal is fed to a synchronous demodulator in the electronic feedback system, where it is rectified and low-pass filtered. The rotation-rate-change signal is applied to an integrator (9) whose output voltage is proportional to rotation rate.

The voltage-controlled oscillator (VCO) (10) then generates a relative frequency shift in the counterpropagating beams, which nulls the phase shift due to the rotation-rate change. The VCO supplies a digital output as a frequency proportional to rotation rate. As previously mentioned in the Brief Description of the Prior Art, technical difficulties and high cost factors arise in an attempt to manufacture a suitable optical frequency shifter 6.

Figure 2:
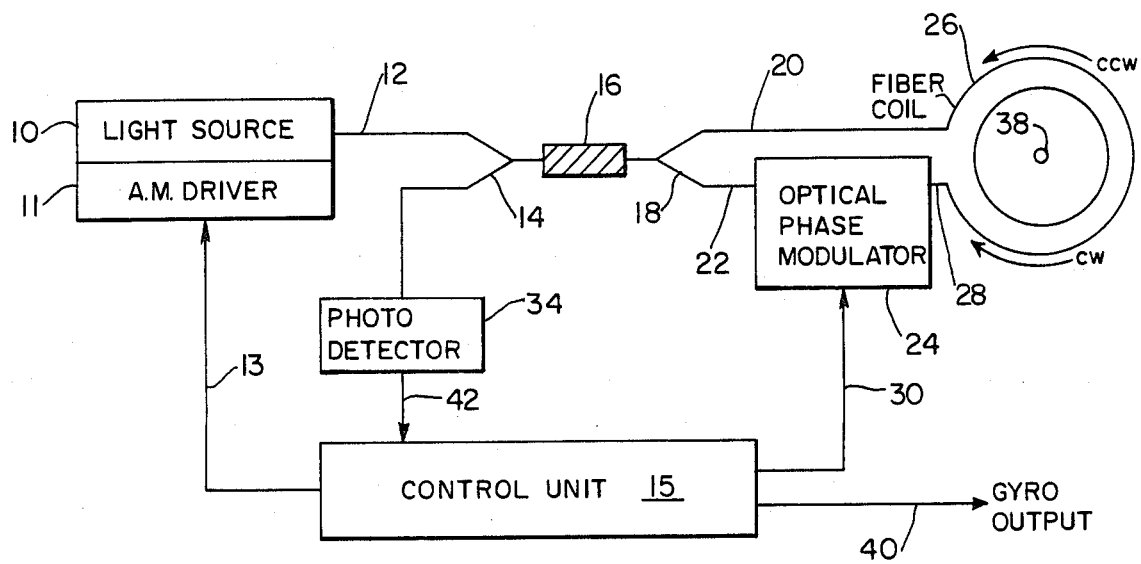
FIG. 2 is a block diagram of the present invention.

Referring to FIG. 2, in order to eliminate these difficulties, the present invention departs from the prior art by utilizing a light source 10 which is driven by an amplitude modulating driver 11. In a preferred embodiment of the invention, the light source is a super radiant diode such as manufactured by General Optronics Corporation of New Jersey and identified in the trade by Model No. GOLS 3000. A light emitting diode or laser diode could also be used. It is desirable for the light source to have a broad optical spectrum to reduce back scatter noise and it should have a Gaussian spectrum shape to reduce the Kerr effect. The driver 11 may be of the type available from General Optronics Corporation and known in the trade as an analog laser transmitter, Model GOANA. Light amplitude from source 10 is modulated in accordance with the input drive voltage along lead 13. The drive voltage is generated in control unit 15 shown in FIG. 3 and discussed hereinafter.

A modulated light source beam 12 is directed to directional optical coupler 14 which serves as a beam splitter. A portion of the beam is transmitted through polarization element 16 for further transmission to a second directional optical coupler 18. The directional couplers are available from the Andrew Corporation of Orland Park, Ill., and identified by the manufacturer as a D-fiber coupler. A suitable polarizing element is available from York Technology Ltd. of Winchester, England.

A second directional coupler 18 is connected through a first optical branch 20 with a fiber coil 26 and through a second branch 22. The purpose of the directional couplers 14, 18 and polarization element 16 are similar to those as discussed in connection with the prior art of FIG. 1. Design considerations for an appropriate alternate fiber optic directional coupler are disclosed in the article "Single Mode Fiber Optic Components," by R. A. Bergh, et al. appearing in SPIE, Vol. 326, Fiber Optics-Technology-82 (1982) at page 137. A standard phase modulator 24 is inserted in branch 22 and serves the purpose of producing an oscillatory relative phase shift between the counterpropagating beams for implementing AC phase-sensitive detection and to enable the rejection of undesired signal components. The actual phase modulator employed may be of a conventional type as described in the article "Closed-Loop, Low-Noise Fiber-Optic Rotation Sensor" by Davis and Ezekiel appearing in Optics Letters, October, 1981, Vol. 6, No. 10, at page 505. With the phase modulator 24 in the circuit location as shown, the clockwise (cw) beam undergoes phase modulation after it has traversed the entire fiber coil 26 and leaves it at point 28. Conversely, the counterclockwise (ccw) beam undergoes phase modulation before entering the fiber coil 26. As a result, the counterpropagating beams exhibit an oscillatory relative phase shift while traversing the coil. The return signal through directional coupler 18 then undergoes polarization at polarization element 16. Thereafter, the beam is split through the previously mentioned directional coupler 14 whereby the mixed signals impinge upon the photodetector 34. The output 42 of the photodetector 34 drives a control unit 15, to be discussed hereinafter which generates an input along lead 30 to the modulator 24. The control unit 15 also generates a signal along lead 40 which constitutes the gyro output representing rotation of the gyro sensing mechanism, namely the fiber coil, about the rotational axis 38. A typical photodetector 34 may be of the type sold by RCA and classified as a silicon photodetector, Model C30815.

Figure 4:
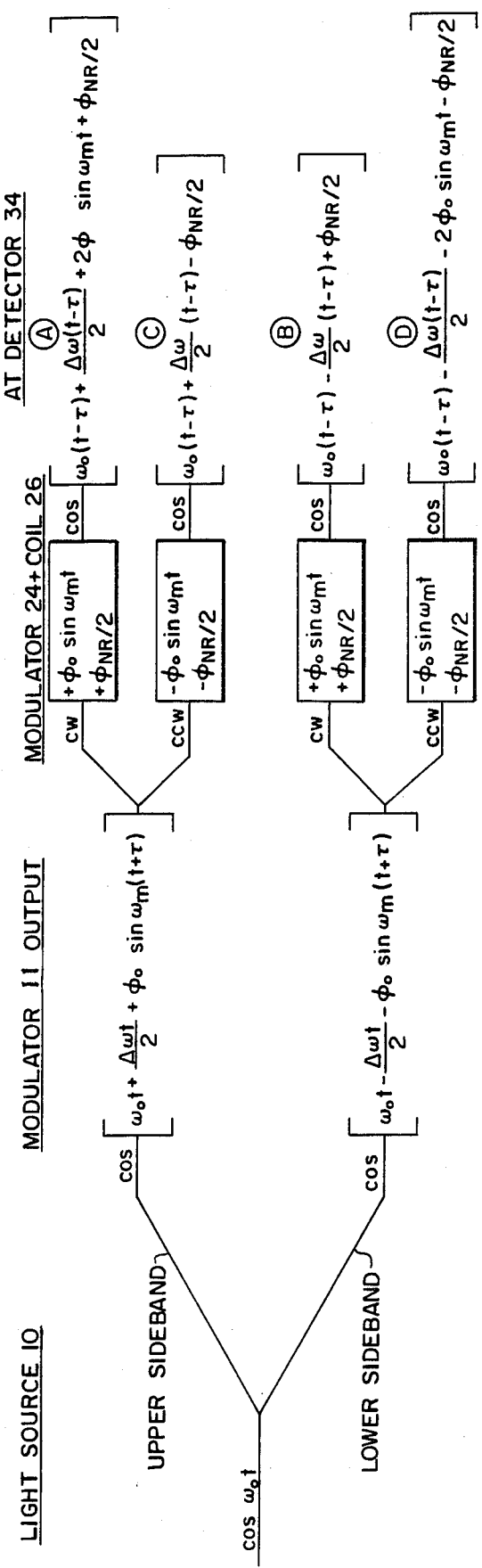
FIG. 4 is a graphical illustration of signals at different circuit points of the present invention.

In order to better understand the present invention, reference is made to FIG. 4 which visually illustrates the transposition of signals between the light source and the detector, on a mathematical basis. The light source 10, absent modulation by driver 11 provides a continuous wave signal in the form of cos $\omega_0 t$. Although the following equations may be generalized and 100 percent modulation is not required, for purposes of simplification we assume that the modulator 11 is operating at 100 percent modulation so that the modulating waveform is of the form:

$$\cos [\Delta\omega t/2 + \phi_0 \sin \omega_m(t+\tau)].$$

The electric vector of the light from the modulated source may be expressed as:

$$E = \cos \omega_0 t \cdot \cos[\Delta\omega t/2 + \phi_0 \sin \omega_m(t + \tau)]$$
$$= \cos(\omega_0 t + \Delta\omega t/2 + \phi_0 \sin \omega_m(t + \tau)) +$$
$$\cos(\omega_0 t - \Delta\omega t/2 - \phi_0 \sin \omega_m(t + \tau)).$$

Schematically, FIG. 4 shows the modulated light output an upper sideband and a lower sideband defined by these equation components. Each sideband includes a phase amplitude term $\phi_0$ and a phase modulation frequency of $\omega_m$. The time delay for light passing through the coil is indicated by $\tau$. The term $\Delta\omega$ appears due to its desired presence at the output of the gyro and as a measure of rotation rate, and as a component of the phase nulling error signal. Inasmuch as the upper and lower sideband components of the modulator output each undergo both clockwise and counterclockwise passage through coil 26, two clockwise and two counterclockwise beams travel through coil 26 as indicated in FIG. 4. The coil due to rotation introduces a non-reciprocal phase shift indicated by the term $\phi_{NR}$. Thus, as will be appreciated, in addition to the light being delayed by a time interval $\tau$, the coil path phase modulator 24 adds a phase shift of $\phi_0 \sin \omega_m t$ to the cw signal, and a phase shift of $\phi_0 \sin \omega_m (t-\tau)$ to the ccw signal. The optical signal arriving at photodetector 34 represents two clockwise and two counterclockwise components as indicated in FIG. 4. By neglecting proportionality constants and small common delays, as has been assumed herein, the clockwise optical signal arriving at the photodetector may be expressed as $$E_{CW} = \cos[(\omega_0 + \Delta\omega/2)(t-\tau) + 2\phi_0 \sin \omega_m t + \phi_{NR}/2] \quad \text{(A)}$$

$$+ \cos[(\omega_0 - \Delta\omega/2)(t-\tau) + \phi_{NR}/2]. \quad \text{(B)}$$

The first term will be called A, and the second B. Likewise, $$E_{CCW} = \cos[(\omega_0 + \Delta\omega/2)(t-\tau) + \phi_0 \sin \omega_m t + \phi_0 \sin \omega_m(t-\tau) - \phi_{NR}/2] \quad \text{(C)}$$

$$+ \cos[(\omega_0 - \Delta\omega/2)(t-\tau) - \phi_0 \sin \omega_m t + \phi_0 \sin \omega_m(t-\tau) - \phi_{NR}/2], \quad \text{(D)}$$

the terms of which are called C and D. Note that in term A, the phase modulation from the amplitude modulator, $\phi_0 \sin \omega_m(t+\tau)$, after the coil delay becomes $\phi_0 \sin \omega_m t$, which adds to a similar term from the coil phase modulator. In term B, the two phase modulation terms have opposite signs and so cancel.

Using the identity
$\sin \alpha - \sin \beta = 2 \cos \frac{1}{2}(\alpha+\beta) \cdot \sin \frac{1}{2}(\alpha-\beta)$, in term D,
$-\phi_0[\sin \omega_m t - \sin(\omega_m t - \omega_m \tau)] = -2\phi_0[\cos(\omega_m t - \omega_m \tau/2) \cdot \sin(\omega_m \tau/2)]$ At this point we choose $\omega_m$ such that $\cos(\omega_m \tau/2) = 0$, and $\sin(\omega_m \tau/2) = 1$. By the identity
$\sin \alpha + \sin \beta = 2 \sin \frac{1}{2}(\alpha+\beta) \cdot \cos \frac{1}{2}(\alpha-\beta)$, in term C
$\phi_0[\sin \omega_m t + \sin(\omega_m t - \omega_m \tau)] = 2\phi_0[\sin(\omega_m t - \omega_m \tau/2) \cos(\omega_m \tau/2)]$ With these reductions, $E_{CW}$ and $E_{CCW}$ become, $$E_{CW} = \cos\left[\left(\omega_0 + \frac{\Delta\omega}{2}\right)(t-\tau) + 2\phi_0 \sin \omega_m t + \phi_{NR}/2\right] \quad \text{(A)}$$

$$+ \cos\left[\left(\omega_0 - \frac{\Delta\omega}{2}\right)(t-\tau) + \phi_{NR}/2\right], \text{ and} \quad \text{(B)}$$

$$E_{CCW} = \cos\left[\left(\omega_0 + \frac{\Delta\omega}{2}\right)(t-\tau) - \phi_{NR}/2\right] \quad \text{(C)}$$

$$+ \cos\left[\left(\omega_0 - \frac{\Delta\omega}{2}\right)(t-\tau) - 2\phi_0 \sin \omega_m t - \phi_{NR}/2\right]. \quad \text{(D)}$$

We now write down all the cross product terms, using the identity $\cos \alpha \cdot \cos \beta = \frac{1}{2} \cos(\alpha-\beta) + \frac{1}{2} \cos(\alpha+\beta)$.

Since terms A, B, C, and D all contain optical frequency terms $\omega_0$, we ignore the double optical frequency terms which are not observable in the photocurrent. Terms AD and BC are the only two products where $\Delta\omega\tau$ and $\phi_{NR}$ can be expected to appear together, for these are the only cases where different optical frequencies go in opposite directions.

Again, neglecting factors of proportionality for simplicity, $AD = \cos(\Delta\omega t - \Delta\omega\tau + \phi_{NR} + 4\phi_0 \sin \omega_m t)$, $BC = \cos(\Delta\omega t - \Delta\omega\tau - \phi_{NR})$, $AB = \cos(\Delta\omega t - \Delta\omega\tau + 2\phi_0 \sin \omega_m t)$, $CD = \cos(\Delta\omega t - \Delta\omega\tau + 2\phi_0 \sin \omega_m t)$, $AC = \cos(\phi_{NR} + 2\phi_0 \sin \omega_m t)$, and $BD = \cos(\phi_{NR} + 2\phi_0 \sin \omega_m t)$.

Figure 3:
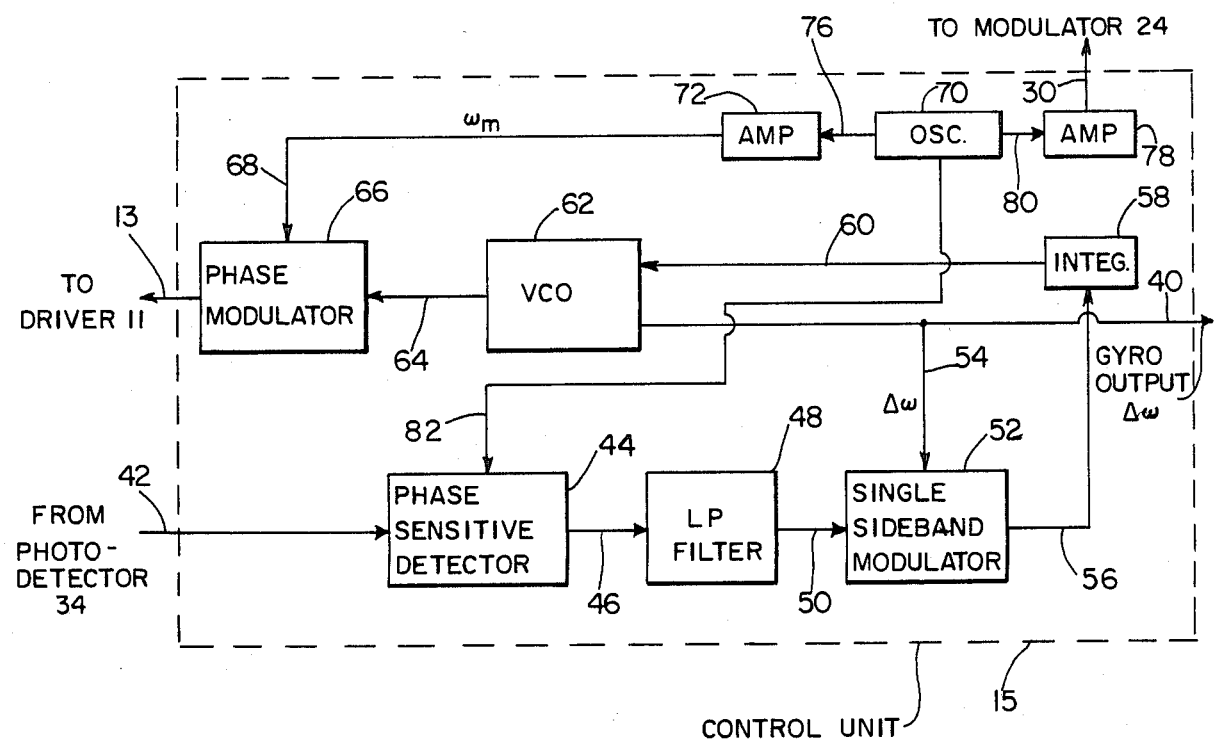
FIG. 3 is a block diagram of a control unit in accordance with the present invention.

FIG. 3 illustrates the control unit 15 which processes the components represented in the last six equations. Specifically, a conventional phase sensitive detector 44 receives a signal from the output of photodetector 34 containing the signal components represented by these six equations.

Using the identity $$\cos(\alpha+\beta) = \cos \alpha \cos \beta - \sin \alpha \sin \beta,$$

$AD = \cos(\Delta\omega t - \Delta\omega\tau + \phi_{NR}) \cos(4\phi_0 \sin \omega_m t)$
$\sin(\Delta\omega t - \Delta\omega\tau + \phi_{NR}) \sin(4\phi_0 \sin \omega_m t)$.

Since a term of the form $\cos(u \sin x)$ yields Bessel terms $J_0, J_2, \ldots$, and $\sin(u \sin x)$ yields $J_1, J_3, \ldots$, and since we are interested only in terms at $\omega_m$, we retain only the second part of AD, and similarly of AB, etc.

$AD = -\sin(\Delta\omega t - \Delta\omega\tau + \phi_{NR})(2J_1(4\phi_0) \sin \omega_m t)$, $BC = 0$ at $\omega_m$, $AB = CD = -\sin(\Delta\omega t - \Delta\omega\tau)(2J_1(2\phi_0) \sin \omega_m t)$, and $AC = BD = -\sin(\phi_{NR})(2J_1(2\phi_0) \sin \omega_m t)$.

Thus, the control unit 15 is now operating upon a simplified set of three terms, as represented by the last four equations. The phase sensitive detector 44 multiplies the sum of these terms by $\sin \omega_m t$ and the resultant signal undergoes low pass filtering at 48. At filter output 50 this yields the signal:

$E_s = -2[J_1(4\phi_0) \sin(\Delta\omega t - \Delta\omega\tau + \phi_{NR}) + 2J_1(2\phi_0)$
$\sin(\Delta\omega t - \Delta\omega\tau) 2J_1(2\phi_0) \sin \phi_{NR}]$.

The mathematics becomes further simplified by an analysis of the Bessel functions.

We next choose $\phi_0$ such that $J_1(2\phi) = 0$, the first non-zero root of which is $J_1(2 \times 1.9158) = 0$, for which root $J_1(4 \times 1.9158) = J_1(7.6634) = 0.1673$.

This leads to $E_s = -2 \times 0.1673 \sin(-\Delta\omega\tau + \phi_{NR} + \Delta\omega t)$, the last two terms having vanished by virtue of $J_1(2\phi_0)$.

The $\Delta\omega t$ term is next removed by a full conventional electronic single sideband modulator 52 down-shifting by $\Delta\omega t$. It is normally not sufficient to just multiply by $\sin \Delta\omega t$, for the residual $2\Delta\omega t$ term may still lie within the servo pass band (typically 100 Hz) for $\Delta\omega < 50$ Hz. A preferred down-shifting operation may be represented by the identity:

$$\frac{\sin(\alpha+\beta) - \cos \alpha \sin \beta}{\cos \beta} = \sin \alpha,$$

where $\alpha$ is identified with $(-\Delta\omega t\phi_{NR})$, $\beta$ is identified with $\Delta\omega t$, and since $(-\Delta\omega\tau+\phi_{NR})$ is vanishingly small at null, $\cos\alpha=1$. Therefore $$E'_s = -0.3346 \left[ \frac{\sin(-\Delta\omega\tau + \phi_{NR} + \Delta\omega t) - \sin\Delta\omega t}{\cos\Delta\omega t} \right]$$

$$= -0.3346 \sin(-\Delta\omega\tau + \phi_{NR}).$$

The variable $E'_s$ corresponds to the output at 56 of the single sideband modulator 52 and is more generally a measure of the error in phase nulling the gyro. It is identical in form to the output from block 8 of the prior art gyroscope of FIG. 1.

Generation of both sine and cosine of $(-\Delta\omega\tau+\phi_{NR}+\Delta\omega t)$ are not required, which might be difficult in this case, and it works whether $\Delta\omega$ is within or is larger than the information bandwidth. It is crucial to this form of single sideband modulation that $\cos\alpha \equiv \cos(-\Delta\omega\tau+\phi_{NR})$ can be adequately approximated by $\cos\alpha=1$, which of course is true here since $(-\Delta\omega\tau+\phi_{NR})$ is driven to null by the servo loop.

Separation of the AD term from the BC term of the aforementioned equations requires both the source phase modulation and the coil phase modulation. Either one alone does not yield a means for rejection of one but not the other of AD and BC.

In order to complete a servo loop, the single sideband modulator output 56 undergoes filtering by means of a conventional integrator 58, or other filter the output of which (60) is introduced to a conventional voltage controlled oscillator (VCO) 62. The output of the VCO is connected at 64 to a conventional electronic phase modulator 66 which generates an electronic signal for the amplitude modulator driver 11. The second output of the VCO is present on lead 40 and represents a digital output as a frequency proportional to rotation rate. The second VCO output is also connected in parallel with a second input 54 of single sideband modulator 52. In order to generate the necessary modulating fixed frequency $\omega_m$, an oscillator 70 furnishes the fixed frequency to a first amplifier 78, along connecting lead 80. The output of the amplifier serves as a first output of the control unit 15, along lead 30, for connection to the input of optical phase modulator 24 (FIG.2). The oscillator 70 is also connected to a second amplifier 72, along connecting lead 76 which supplies a drive i signal of different gain but of fixed frequency $\omega_m$ to a second input of phase modulator 66, along connecting lead 68.

In the simplest solution for Bessel function argument selection, the phase modulation amplitude $\phi$ is assumed to be the same for both the phase modulator 24 and the light source driver 11. Further, the frequency $\omega_m$ is assumed to be the frequency, generated by oscillator 70 for both the phase modulator 66 and optical phase modulator 24 which makes $\sin(\omega_m\tau/2)=1$. However, these conditions may be changed from the simplest solution as herein presented to a generalized solution employing different values of $\phi$'s and $\omega_m$ for the stated units, and a modulation index of less than 100 percent.

The present invention can also be used to measure other non-reciprocal phase shifts, for example, Faraday effect current sensors.

It should be understood that the invention is not limited to the exact details of construction shown and described herein for obvious modifications will occur to persons skilled in the art.

I claim:

1. A fiber optic gyro comprising:
   a source of light;
   amplitude modulating and source driving means for driving the source;
   an optic fiber coil rotatable about an axis of sensitivity;
   means for optically coupling light from the source to the coil to create counterpropagating beams therethrough;
   means connected intermediate the coupling means and the coil for optically phase modulating the beams propagating
   (a) in a first direction prior to introduction into the coil,
   (b) in a second counterpropagating direction after passage through the coil;
   photodetecting means receiving the optically phase modulated counterpropagated light beams, for producing a signal at its output responsive to the coil rotation rate;
   control means having its input connected to the photodetecting means output for translating the output signal from the photodetecting means to a variable frequency signal responsive to coil rotation rate;
   feedback means connecting an output of the control means to the amplitude modulating and source driving means for generating a phase-modulated source driving signal.

2. The structure set forth in claim 1 wherein the control means comprises:
   a phase sensitive detector having a first input connected to the photodetecting means output and a second input connected to a fixed reference frequency.

3. The structure of claim 2 wherein the control means further comprises single sideband modulating means having a first input thereof connected to the output of the phase sensitive detector, a second input of the single sideband modulating means being connected to the error signal for generating at its output a modulated signal which is a measure of the rotating rate.

4. The structure set forth in claim 3 wherein the control means further comprises a voltage controlled oscillator, and integrating means connected between the single sideband modulating means and an input of the voltage controlled oscillator for producing a variable frequency signal at the output of the voltage controlled oscillator which is the error signal.

5. The structure set forth in claim 4 wherein the control means further comprises means having a first input thereof connected to a second output of the voltage controlled oscillator and a second input connected to a fixed frequency for phase modulating a variable frequency signal from the voltage controlled oscillator and producing a control means output for connection to the amplitude modulating and source driving means.

6. A method for phase nulling a fiber optic gyro comprising the steps:
   amplitude modulating a continuous source of light;
   splitting the amplitude modulated light into two beams;
   directing the beams in counterpropagating directions, around an optic fiber rotatable about an axis of sensitivity;
   subjecting a first counterpropagating beam to optical phase modulation before entry to the optic fiber;

subjecting a second counterpropagating beam to optical phase modulation after exiting from the optic fiber;

subjecting the phase modulated counterpropagating beams to photodetection wherein a photodetected signal is produced responsive to the coil rotation rate;

translating the photodetected signal to a corresponding variable frequency signal; and feeding back a signal indicative of the variable frequency signal to influence the amplitude modulating of the light source in a manner nulling the non-reciprocal phase shift in the coil, due to rotation;

wherein the variable frequency of the variable frequency signal is a measure of coil rotation rate.

7. The method of claim 6 wherein translating the photodetected signal to a corresponding variable frequency signal includes the step of phase detecting the photo detected signal with a fixed frequency.

8. The method of claim 7 wherein the photodetected signal translation includes the step of single sideband modulating the detected signal with the variable frequency signal.

9. The method of claim 8 wherein the single sideband modulated signal generates oscillations modulated with a fixed frequency for the feeding back of a signal which controls the amplitude modulating of the light source.

10. An optical interferometer comprising:

a source of light;

amplitude modulating means for driving the source of light;

signal generating means for driving the amplitude modulating means comprising a source of a variable frequency sinusoid phase modulated at a fixed phase modulation frequency;

an optical fiber coil producing a non-reciprocal phase shift responsive to a phenomenon to be measured;

means for optically coupling light from the source of light to the optical fiber coil to create counterpropagating beams therethrough;

means located assymmetrically in the coil path for optically phase modulating the counterpropagating beams at the said fixed modulation frequency;

photodetecting means receiving the counterpropagating light beams for producing a signal responsive to both the said non-reciprocal phase shift and a second non-reciprocal phase shift created by the said variable frequency;

means setting the frequency and phase modulation amplitudes of said phase modulations such that unwanted signal components vanish at the frequency of a selected harmonic of the said phase modulations frequency;

signal processing means for changing the signal from the photodetecting means to a signal which is a function only of the algebraic sum of the two said non-reciprocal phase shifts when that sum is small; and adjustment means whereby said signal responsive to the algebraic sum of the two said non-reciprocal phase shifts is made to vanish by adjusting said variable frequency;

whereby the said variable frequency is output as a measure of the phenomenon to be measured.

* * * * *